United States Patent [19]

Beckett

[11] Patent Number: 4,685,997

[45] Date of Patent: * Aug. 11, 1987

[54] PRODUCTION OF DEMETALLIZED PACKAGING MATERIAL

[76] Inventor: Donald E. Beckett, 963 Tennyson Ave., Mississauga, Ontario, Canada, L5H 2Y9

[ * ] Notice: The portion of the term of this patent subsequent to Sep. 9, 2003 has been disclaimed.

[21] Appl. No.: 874,406

[22] Filed: Jun. 16, 1986

[51] Int. Cl.⁴ .............................. B44C 1/22; C23F 1/02
[52] U.S. Cl. ................................ 156/629; 156/634; 156/665; 156/668
[58] Field of Search .............. 156/634, 629, 635, 656, 156/665, 230, 233, 240, 668; 252/29.5

[56] References Cited

U.S. PATENT DOCUMENTS 3,664,913  5/1972  Ratcliff ............................... 156/345
4,610,755  9/1986  Beckett .............................. 156/643

Primary Examiner—Kenneth M. Schor
Attorney, Agent, or Firm—Sim & McBurney

[57] ABSTRACT

Patterned laminates are formed by printing an image of an etchant on one web and laminating the printed web so that the image is sandwiched between the webs in contact with a metallized film. The etchant then dissolves the metallized surface in the printed areas to provide the desired pattern. The resulting laminate may be used as packaging material.

10 Claims, 1 Drawing Figure

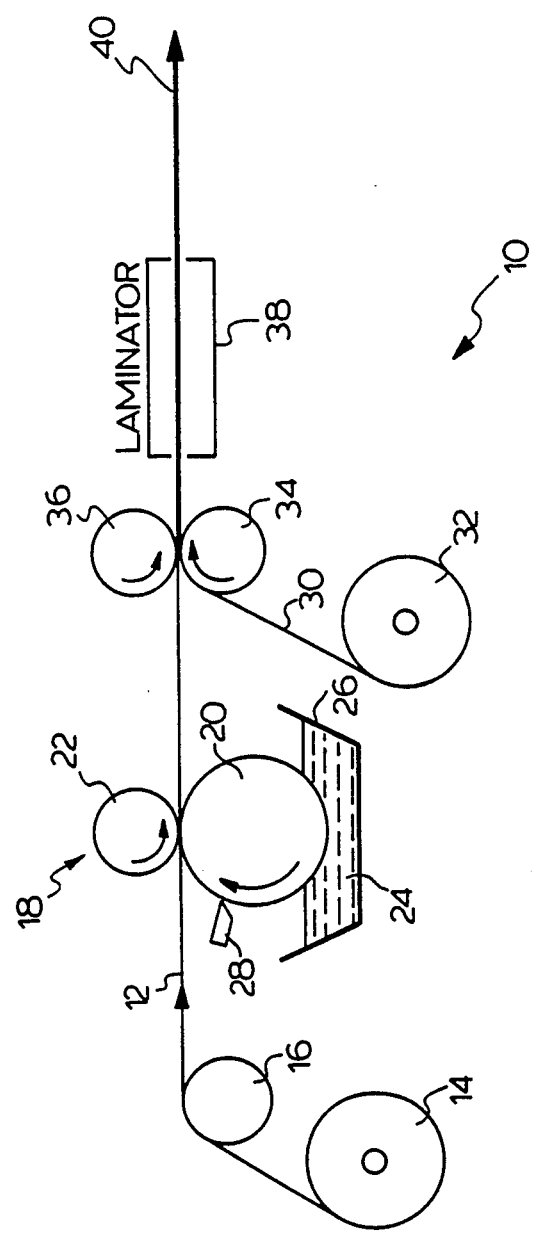

PRODUCTION OF DEMETALLIZED PACKAGING MATERIAL

FIELD OF INVENTION

The present invention relates to the formation of packaging material having a decorative appearance from selective demetallizing.

BACKGROUND TO THE INVENTION

In my U.S. Pat. No. 4,398,994, the disclosure of which is incorporated herein by reference, I have described a continuous method of forming decorative patterns of aluminized plastic film and the use of such patterned film in packaging. As is described therein, a web of aluminized polymer film is printed with a pattern of etchant-resistant material, corresponding to the pattern desired on the aluminized surface. Aqueous sodium hydroxide solution having a concentration of up to about 25 wt. % is applied, at a temperature of about 15° to about 100° C., across the whole width of the web to contact the pattern on the web. The sodium hydroxide solution is allowed to remain in contact with the web as it is conveyed for about 0.1 to about 10 seconds to permit the sodium hydroxide to dissolve aluminum only from areas of the web not having the pattern of etchant-resistant material applied thereto. The spent sodium hydroxide solution is washed from the web to leave the pattern of etchant-resistant material on the transparent polymeric film. The various steps of the operation are effected consecutively at a web speed of up to about 1000 ft/min.

The apparatus illustrated in the aforementioned patent utilizes rollers dipping into baths of liquid to effect the various steps. This manner of application of etchant and of wash water has been found to be somewhat inefficient in ensuring a consistent product at high speeds of operation and also to be uneconomical with respect to utilization of sodium hydroxide etchant.

In an attempt to overcome those difficulties, in my U.S. Pat. No. 4,552,614, the disclosure of which is incorporated herein by reference, I have described a procedure in which the etchant is spray applied to the film to impinge thereon, scrapers may be used to assist in removal of etched material, warm water sprays wash the spent etchant from the film surface, the washed film is hot air dried and the air-dried film is chilled-roll cooled. By proceeding in this manner, high speed operations may be effected to produce a consistent product with economical use of etchant.

In addition, in my copending U.S. patent application Ser. No. 723,909 filed Apr. 16, 1985 (now U.S. Pat. No. 4,610,755), the disclosure of which is incorporated herein by reference, I have described a procedure in which the metallized surface of an inert substrate film is printed with a pattern of a water-based printing varnish having an etchant dissolved therein, the pattern is permitted to remain in contact with the metallized surface for a period of time sufficient to etch the pattern onto the metallized surface, spent etchant is washed from the film and the washed film is dried.

In each of my prior procedures, etchant is applied to the metallized substrate surface, the desired pattern is allowed to form, and spent etchant is washed from the etched surface. In order to perform such procedures rapidly on continuous webs of metallized film, as is necessary for economic operation, etchant solutions of elevated temperature and high concentration are required and a washing step is necessary to remove spent etchant.

SUMMARY OF INVENTION

In accordance with the present invention, there is provided a method of forming a patterned packaging material, which comprises providing a first web of metallized material; providing a second web of material which is laminatable to the first web; printing a pattern of etchant material on one of the webs; and laminating the first web to the second web with the pattern of etchant material sandwiched between the metallized surface of the first web and the abutting face of the second web.

By providing a laminate of patterned metallized film overlaid with a second film, the time required for the etchant to form the pattern is separated from machine speed. Upon contact of the etchant with the metallized surface, etching commences but need not be completed at the time of lamination. After formation of the laminate, the etchant can be permitted to work on the portions of the metallized surface with which it is in contact until the desired pattern is formed. Elevated temperature and s high reactant concentration etchant solution, therefore, are not required. In addition, since the etchant is not exposed but rather is completely incorporated into the laminate, washing of spent etchant also is not required.

The pattern of etchant may be printed directly on the metallized film or, more preferably, is printed on the second web or backing sheet, so that the pattern then only contacts the metallized surface on lamination. This "offset" manner of transfer of the patterns to the metallized surface provides effective control over undesired etchant spread and ensures that a sharp pattern results.

The metallized web usually is a flexible web of metallized polymeric material but other materials of construction may be employed. The second web or backing sheet preferably is constructed of flexible polymeric material, although any other material laminatable to the metallized web may be employed, for example, paper.

BRIEF DESCRIPTION OF DRAWING

The sole FIGURE of the drawing is a schematic representation of an apparatus for carrying out the method of the present invention.

DESCRIPTION OF PREFERRED EMBODIMENT

Referring to the drawing, there is schematically illustrated therein an apparatus 10 for providing a laminating sheet. A web 12 of plastic film is drawn from a roll 14 thereof. The substrate polymer film may be any convenient flexible polymeric material chemically resistant to the etchant but laminatable to another polymeric film. The polymer material usually is transparent but may be translucent.

The web 12 of plastic film is drawing over a first roll 16 to a printing station 18. The printing station comprises an etched gravure printing roll 20 and a backing roll 22 which serves to maintain the web in contact with the printing roll 20. The gravure printing roll 20 bears the image to be formed on the web 12.

The printing roll 20 dips into and rotates through an etchant bath 24 housed in a suitable tank 26. The etchant bath comprises a water-based gravure printing varnish having sodium hydroxide dissolved therein. A doctor blade 28 is used to wipe excess printing varnish from the surface of the gravure roll 20 and leave printing varnish only in the recessed portion of the gravure roll, corresponding to the image printed on the web.

Any alternative printing method may be adopted for printing the desired image on the web 12.

As the web 12 engages the wetted image of the gravure roller 20, the corresponding pattern is printed on the surface of the web 12 contacting the gravure roller 20. The water-based gravure printing varnish ensures that etching ultimately occurs only in the desired areas and does not run into the adjacent areas. In this way, the final etched image, formed as described below, is sharp and has the desired appearance.

The water-based gravure printing varnish used in the bath 24 is a conventional unpigmented water-based printing ink useful in gravure printing. These materials generally comprise water and a water-soluble binder, which may be acrylic based. The sodium hydroxide is dissolved in the aqueous base to provide the etchant medium. The quantity of sodium hydroxide employed may vary widely and may be very low, since it is not important to the invention that the etching be complete within a specific time frame. Generally, the sodium hydroxide concentration is below 15 wt. % of the varnish, preferably below 5 wt. % and more preferably about 0.5 to about 4 wt. %.

The process operates satisfactorily at ambient temperatures since speed of etching is not a significant parameter. Elevated temperatures, however, may be used, if desired, by suitable heating of the bath 24.

Following printing of the web 12 with the desired image, the printed face of the web 12 is brought into face-to-face engagement with the metallized surface of a second web 30 of polymeric material fed from a roll 32 by passing them through the nip between a pair of rolls 34 and 36. The web 30 is formed of any convenient polymeric material which is laminatable with the web 12. Typically the film is formed of a polyester material, for example, that sold under the trade mark "Mylar". The metal film adhered to the polymeric material web 30 as the upper surface in the illustration, may be any convenient metal which can be solubilized by chemical etching. The metal usually is aluminum, but other metals, such as copper, may be used. The thickness of the metal film may vary widely within the range of about 10 to about 1000 Angstroms, preferably about 300 to 600 Angstroms, and may vary in appearance from opaque to transparent. In the case of aluminum as the metal, the chemical etchant commonly is aqueous sodium hydroxide solution and this description of the preferred embodiment is directed to this combination. Other combinations of etchants and metals, however, may be employed.

The combination of polymeric materials forming the webs 12 and 30 may provide desired properties to the laminate ultimately formed, for example, heat sealing properties or improved strength properties.

Once the printed image of etchant material on the web 12 engages the metallized surface of the web 30, etching of the metallized surface commences in the same pattern as the printed image.

The face-abutted polymeric material webs 12 and 30, with the printed image in contact with the metallized surface, are then passed through a laminator 38 of conventional construction to form a laminate 40. In this way, the printed image on the web 12 is sandwiched and fixed between the metallized surface of the web 30 and the abutting surface of the web 12 in the laminate 40.

The etchant contained in the printed image then is able to precisely etch the desired pattern in the metallized surface without the time constraints attendant the prior art demetallizing procedures discussed above.

Although the invention has been described with respect to the embodiment wherein the etchant image is printed on the backing sheet of the laminate, the invention also may be effected by printing the etchant image directly onto the metallized film prior to lamination with the backing sheet.

The laminated structure 40 may be reeled up for later processing or may be subjected to a single or multiple one-color printings by any convenient printing procedure. The machine 10 is capable of operating at speeds which are compatible with those of flexographic and gravure printing presses, so that formation of the latent image in the laminate may be run on-line with subsequent color printing of the laminate on modern film-printing machinery.

The apparatus 10, therefore, produces a laminate 40 wherein etchant in a desired pattern is in contact with a metallized surface, so that the corresponding pattern is etched in the metallized surface. The formation of the final pattern in the metallized surface is not time dependent, so that a wide variety of running speeds is possible independent of the rate of formation of the etched pattern. No washing step is required since the etchant and etched material are both sandwiched between the polymeric material webs.

As mentioned previously, the present invention is not limited to the use of polymeric material webs, but rather includes any pair of laminatable materials one of which bears an etchable metallized surface.

The laminate 40 which is formed as described above may be used as is or after color printing, as a packaging material for a variety of products, employing conventional packaging techniques, such as form-and-fill.

SUMMARY OF DISCLOSURE

In summary of this disclosure, the present invention provides an improved method for forming a laminate having an image etched therein by reliable high speed continuous operation. Modifications are possible within the scope of this invention.

What I claim is:

1. A method of forming a patterned packaging material, which comprises:
   providing a first web of metallized material,
   providing a second web of material which is laminatable to the first web,
   printing a pattern of etchant material on one of the webs, and
   laminating the first web to the second web with said pattern of etchant material sandwiched between the metallized surface of the first web and the abutting face of the second web.

2. The method of claim 1, wherein said first web is a web of polymeric material having a metallized surface thereon.

3. The method of claim 2, wherein said second web is a web of polymeric material laminatable with the polymeric material of said first web.

4. The method of claim 2, wherein said second web is a web of paper laminatable with the polymeric material of said first web.

5. The method of claim 1, wherein said pattern of etchant material is printed on said second web.

6. The method of claim 1, wherein said metallized material comprises aluminum and said etchant material comprises sodium hydroxide.

7. A continuous method of forming a patterned packaging material, which comprises:
   providing a first continuous web of polymeric material which is metallized on one surface thereof,
   providing a second continuous web of polymeric material,
   printing a pattern of etchant material on one surface of said second continuous web,
   bringing said one metallized surface of said first continuous web into face-abutting relationship with the one surface of said second continuous web, and
   laminating said face-abutted webs together so as to sandwich said pattern of etchant material in engagement with said metallized surface and form an etched pattern in said metallized surface.

8. The method of claim 7 wherein said pattern of etchant material is provided by printing a pattern of a water-based gravure printing varnish having said etchant dissolved therein.

9. The method of claim 8 wherein said varnish is an acrylic-based aqueous varnish.

10. The method of claim 7 wherein said metal is aluminum, said etchant is sodium hydroxide, and said etchant is applied as an aqueous solution of concentration less than about 5 wt. %.

* * * * *